(12) United States Patent
Deimling

(10) Patent No.: US 7,208,950 B2
(45) Date of Patent: Apr. 24, 2007

(54) MAGNETIC RESONANCE APPARATUS AND OPERATING METHOD THEREFOR EMPLOYING A STEADY-STATE PULSE SEQUENCE

(75) Inventor: Michael Deimling, Möhrendorf (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 10/860,893

(22) Filed: Jun. 4, 2004

(65) Prior Publication Data
US 2005/0007112 A1    Jan. 13, 2005

(30) Foreign Application Priority Data
Jun. 5, 2003   (DE)   ............... 103 25 562

(51) Int. Cl.
*G01V 3/00*   (2006.01)
(52) U.S. Cl. .................. 324/309; 324/318
(58) Field of Classification Search ........... 324/307, 324/309, 318, 319, 322, 312, 314, 300, 407; 600/410–422
See application file for complete search history.

(56) References Cited

U.S. PATENT DOCUMENTS

| | | | | |
|---|---|---|---|---|
| 4,165,479 A * | 8/1979 | Mansfield | ............... | 324/313 |
| 4,707,658 A * | 11/1987 | Frahm et al. | ............... | 324/309 |
| 4,769,603 A | 9/1988 | Oppelt et al. | | |
| 5,281,917 A * | 1/1994 | Santyr | ............... | 324/309 |
| 5,404,882 A * | 4/1995 | Santyr | ............... | 600/410 |
| 5,420,510 A * | 5/1995 | Fairbanks et al. | ............... | 324/309 |
| 5,541,514 A * | 7/1996 | Heid et al. | ............... | 324/309 |
| 6,064,203 A * | 5/2000 | Bottomley | ............... | 324/309 |
| 6,339,332 B1 * | 1/2002 | Deimling | ............... | 324/309 |
| 6,366,090 B1 * | 4/2002 | Heid | ............... | 324/307 |
| 6,366,091 B1 * | 4/2002 | Takahashi et al. | ............... | 324/309 |
| 6,404,195 B1 * | 6/2002 | Deimling | ............... | 324/308 |
| 6,452,387 B1 * | 9/2002 | Hargreaves et al. | ............... | 324/300 |
| 6,728,569 B2 * | 4/2004 | Edelman | ............... | 600/410 |
| 2004/0152969 A1 * | 8/2004 | Zhang et al. | ............... | 600/422 |

OTHER PUBLICATIONS

"Imaging Sequences in Magnetic Resonance Tomography and their Clinical Application (Part 1)," Nitz, electromedica, vol. 64, No. 1 (1996), pp. 23-29.
"Imaging Sequences in Magnetic Resonance Tomography and their Clinical Application (Part 2)," Nitz, electromedica, vol. 64, No. 2 (1996), pp. 48-51.
"Imaging Sequences in Magnetic Resonance Tomography and their Clinical Application (Part 3)," Nitz, electromedica, vol. 65, No. 1 (1997), pp. 8-14.
"Cardiac Imaging with Single Shot Black Blood Fiesta: A Comparison with Double Inversion Fast Spin Echo Imaging," Glockner et al, Proc. Intl. Soc. Mag. Reson. Med. 10 (2002).

(Continued)

*Primary Examiner*—Brij B. Shrivastav
(74) *Attorney, Agent, or Firm*—Schiff Hardin LLP

(57) ABSTRACT

In a method for operating a magnetic resonance apparatus with a steady-state pulse sequence and a magnetic resonance apparatus for implementing the method, to reduce magnetization in an examination subject outside of a slice of interest, an RF pulse acting selectively on a slice of interest and an RF pulse acting non-selectively on a slice of interest are alternately emitted to an examination subject in a steady-state pulse sequence.

14 Claims, 4 Drawing Sheets

OTHER PUBLICATIONS

"Real-Time Black-Blood MRI Using Spatial Presaturation," Nayak et al, J. Mag. Res. Imaging, vol. 13 (2001), pp. 807.

"High Resolution 3D Fast Spin-Echo Black Blood Coronary MRA," Stueber et al, Proc. Intl. Soc. Mag. Reson. Med. 9 (2001), p. 170.

"Initial Experiences with Coronary Vessel Wall Imaging on a 3T Whole Body System," Botnar et al, Proc. Intl. Soc. Mag. Reson. Med. 10 (2002).

"Bildgebende Systeme für die medizinische Diagnostik," Morneburg (1985) pp. 168-173.

* cited by examiner

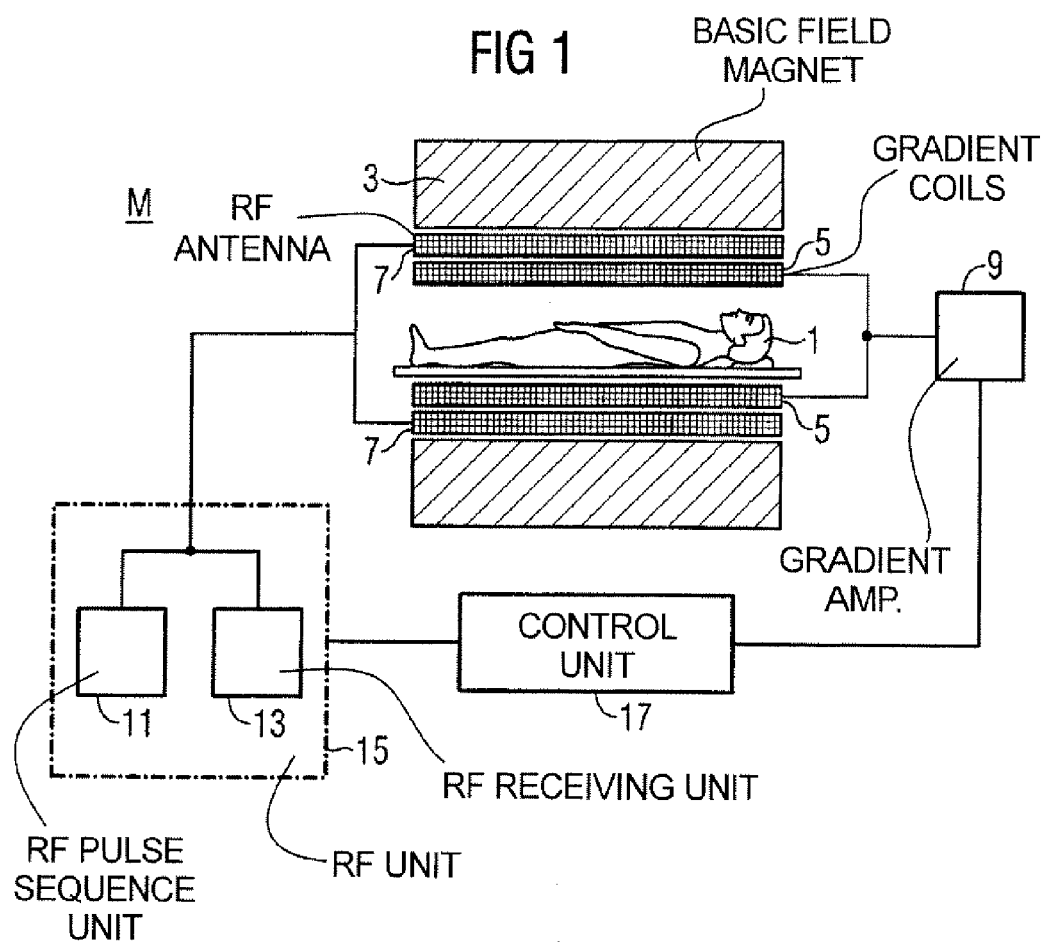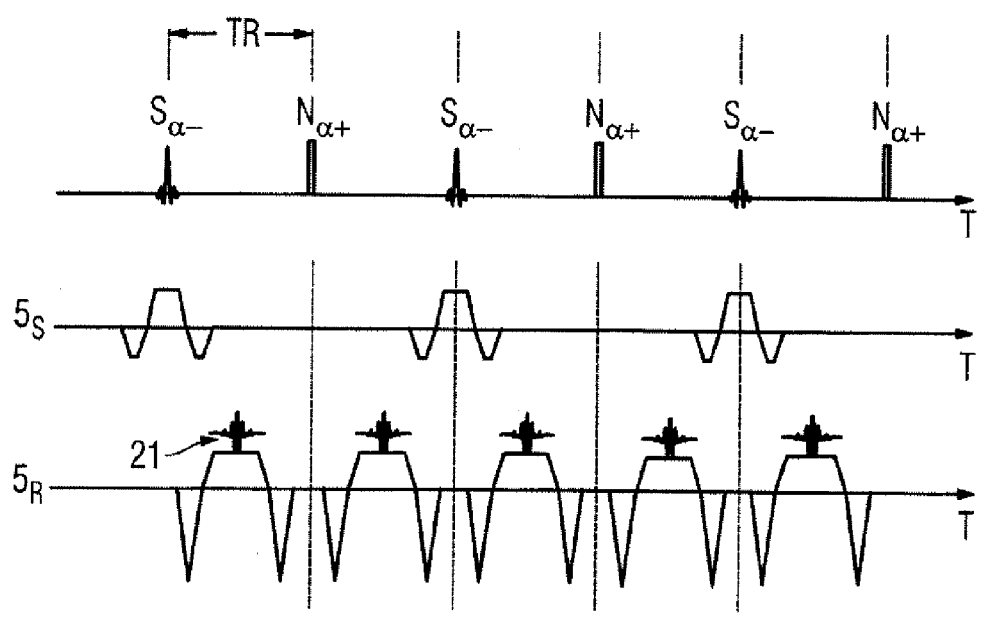

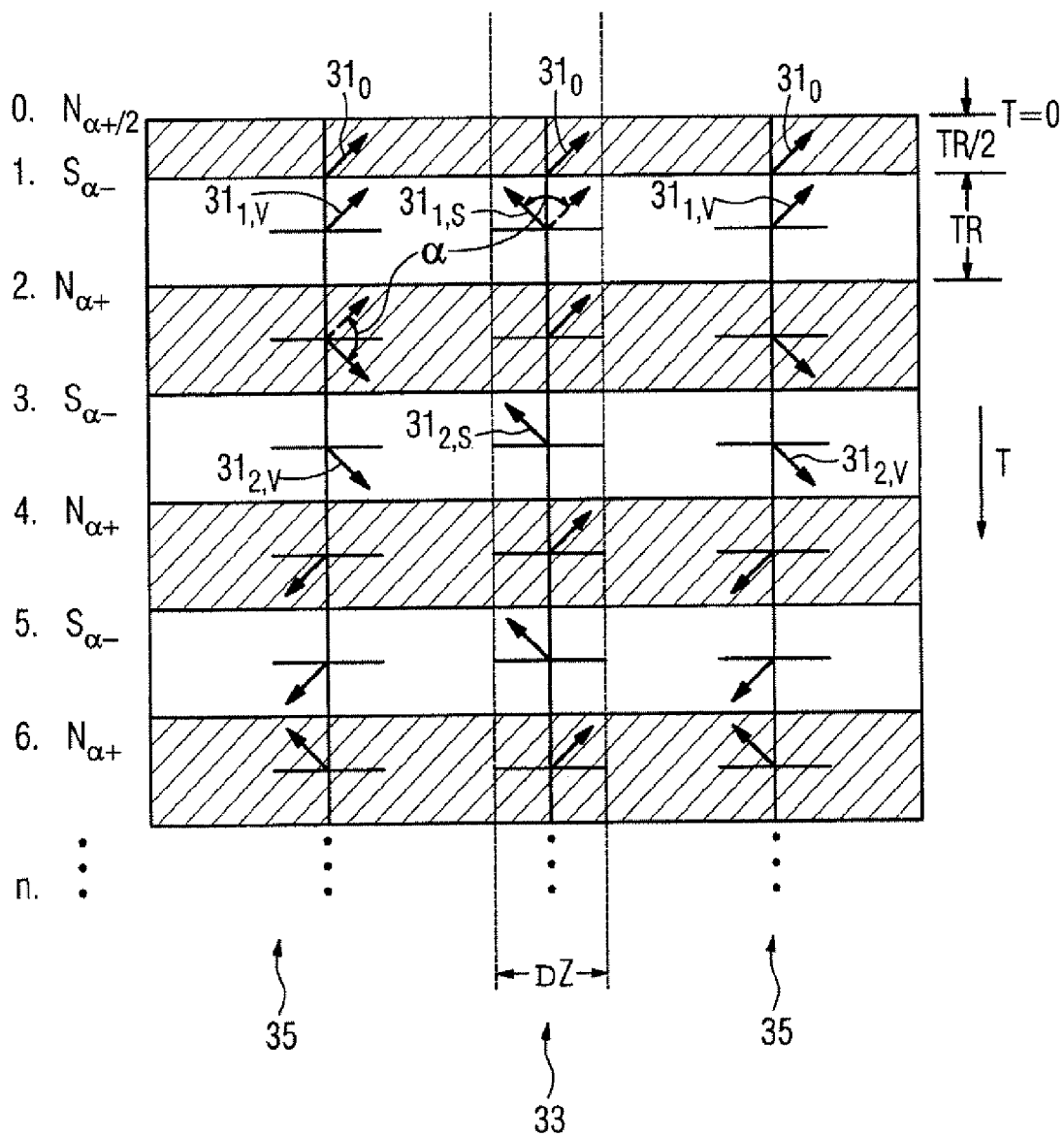

MAGNETIC RESONANCE APPARATUS AND OPERATING METHOD THEREFOR EMPLOYING A STEADY-STATE PULSE SEQUENCE

BACKGROUND OF THE INVENTION

1. Field of the Invention

The present invention concerns a method for operating a magnetic resonance apparatus (MR) with a steady-state pulse sequence. Moreover, the invention also concerns a magnetic resonance apparatus with a sequence for operating an RF unit and a gradient system for implementing such a method,

2. Description of the Prior Art

Fast imaging methods enable the implementation of magnetic resonance examinations in significantly shortened time spans with a significantly reduced repetition time between successive acquisition cycles. They are based on adopting a dynamic equilibrium of the (longitudinal and transverse) magnetization of an examination subject with the aid of steady-state pulse sequences, for example using gradient echoes. After each RF pulse, the magnetization again assumes the same value, meaning that a signal known as a steady-state signal (equilibrium signal) is generated after a specific transient effect duration. The mechanism of the equilibrium formation is explained, for example, in chapter 6.1.8 in "Bildgebende Systeme für medizinlsche Diagnostik", H. Morneburg, (1995) Publicis MCD Verlag.

The equilibrium of the magnetization is achieved after a series of RF pulses with a pulse interval of the repetition time TR, which deflect the magnetization of the spin system by an angle α from its alignment along a basic magnetic field (z-direction). The repetition time TR does not allow a complete relaxation of the magnetization. Small deflection angles effect a relatively large transverse magnetization, which leads to a correspondingly high signal intensity.

A wide variety of imaging methods have been realized that use different steady-state pulse sequences, for example Fast Low Angle Shot (FLASH), Fast Imaging with Steady State Procession (FISP) and modifications of these sequences, PSIF and True-FISP. The pulse sequences differ, for example, in the number of the spatial components of the magnetization which is located in the equilibrium. For example, in the True-FISP pulse sequence a transverse magnetization MXY is refocused and brought into the equilibrium state by means of a phase coder gradient, a readout gradient and a slice selection gradient. Furthermore, the various RF pulse sequences differ, for example, in their transient effect behavior in the dynamic equilibrium state. An overview of the various RF pulse sequences on the basis of a dynamic equilibrium magnetization is given in "Imaging Sequences in Magnetic Resonance Tomography and their Clinical Application", electromedica 64 (1996) no. 1, page 23–29 (part 1), electromedica 64 (1996) no. 2, page 48–51 (part 2), electromedica 65 (1997) no. 1, page 8–14 (part 3). The True-FISP pulse sequence is described in detail in U.S. Pat. No. 4,769,603.

Fast imaging methods generally exhibit the disadvantage of image artifacts possibly arising due to a static magnetic field inhomogeneity or due to an existing chemical shift. A further disadvantage is a susceptibility to contributions from a magnetization that is generated in the environment of the slice to be measured. These can additionally arrive in the slice to be measured due to effects known as inflow effects, for example, in which magnetization generated outside of the slice of interest flows into the slice of interest during the imaging.

The methods described below are based on simple MZ preparation pulses that allow the blood to appear dark.

J. F. Glockner et al. compare a FIESTA sequence with a Double Inversion Fast Spin-Echo sequence in "Cardiac Imaging with Single Shot Black Blood FIESTA: A comparison with Double Inversion Fast Spin-Echo Imaging", ISMRM 2002 (Hawaii), The Black Blood FIESTA sequence thereby uses a non-selective RF inversion pulse which is followed by a slice-selective inversion pulse.

K. S. Nayak et al. specify a real-time method for black blood depiction with the aid of spatial saturation pulses in "Real Time Black Blood MRI Using Spatial Presaturation", JMRI 13, p. 807 (2001).

In "High Resolution 3D Fast Spin-Echo Black Blood Coronary MRA", ISMRM 2001 (Glasgow), p. 170, M. Stuber et al, show that the expansion of what is known as the "Black Blood Coronary" imaging with a 3D acquisition technique can effect further improvements in the signal-to-noise ratio. This would lead to an improved spatial resolution. A combination of a "3D-Fast-Spin-Echo method" with a double inversion pulse is proposed for this.

In "Initial Experiences with Coronary Vessel Wall Imaging on a 3T Whole Body System", ISMRM 2002 (Hawaii), R. M. Botnar et al. indicates that the coronal "Vessel Wall" representation assumes a high spatial resolution due to the small size.

SUMMARY OF THE INVENTION

An object of the present invention is to provide a method employing a steady-state pulse sequence to operate a magnetic resonance apparatus, as well as a magnetic resonance apparatus, which reduce magnetization contribution in an examination subject arising outside of a slice of interest with the aid of an RF pulse sequence.

This object is inventively achieved by a method employing a steady-state pulse sequence to operate a magnetic resonance apparatus, wherein an examination subject is irradiated in alternation by an RF pulse selectively acting on a slice of interest and an RF pulse non-selectively acting on the slice of interest. The basis for this can be, for example, steady-state pulse sequence of the type initially described.

The method employing steady-state pulse sequence according to the invention had the advantage that the magnetization is significantly reduced outside of the slice of interest (this is the imaging slice in magnetic resonance tomography), while at the same time an equilibrium magnetization is adopted within the slice of interest.

The first is effected due to the existence of an alternating direction of the T1. and T2 relaxation for the magnetization in the outer volumes, due to the non-selective RF pulses. T1 and T2 refer to the longitudinal and transverse relaxation times, respectively. This leads to a stronger signal reduction due to a non-aligned magnetization. In contrast to this, the consecutive non-selective and selective RF pulses effect the equilibrium state of the magnetization in the slice of interest.

For example, in the normal True-FISP sequence, blood flowing into the slice causes image artifacts since the high magnetization of the blood has experienced, for example, no α/2 preparation pulse. As a consequence, magnetization oscillations that lead to image interferences are measured as well in the slice. Not only blood flowing in but also blood flowing out of the slice can generate artifacts, since this magnetization can be signal-emitting for some time, even without RF excitation.

In contrast, the steady-state pulse sequence advantageously suppresses strong signal contributions due to inflow effects. The basis for this is that no magnetization that could contribute to the image after flowing into the slice of interest is formed outside of the slice of interest. The blood flowing into the slice is thereby shown dark, for example in dynamic heart examinations with a True-FISP sequence modified according to the invention. For example, ventricle fill defects, valve defects and the like are shown darker due to the mixing of the dark blood. The dark representation ensues not with the aid of an MZ preparation, but rather the magnetization of the blood flowing in is dismantled by the steady-state pulse sequence.

An area known as the "late enhancement" area likewise can be shown with increased contrast after contrast agent administration. The phenomenon that describes the contrast increase of an ischemic area of the myocardium after a number of minutes following contrast agent administration is designated as "late enhancement" in MR imaging. With the True-FISP sequences that will be produced for MR cardiology, the blood of the inner heart chamber (ventricle) is shown with high signal due to the low T1/T2 ratio (approximately 1200 msec/200 msec). Since the ischemic areas often originate from the inner wall of the myocardium, these areas can be better delimited with the low True-FISP signal of the inventive sequence.

In a preferred embodiment of the method employing a steady-state pulse sequence, the RF pulses each effect a deflection of the magnetization vector by an angle $+\alpha$ or $-\alpha$, in particular $0° < |\alpha| \leq 180°$. This has the advantage that the RF pulse sequence of the method corresponds to a True-FISP pulse sequence in which a slice-selection gradient field is activated with only every other pulse.

This embodiment is immediately advantageous with regard to the specific absorption rate (SAR), since this represents a large problem in True-FISP sequences given the use of 3T basic field magnets. For example, the flip angle must be reduced from approximately 80° at 1.5T to approximately 45° at 3T, but this also reduces the contrast between the myocardium and the inner heart chamber (light blood). In the inventive embodiment, an SAR reduction of approximately 33% is achieved by the alternating non-selective and selective pulses.

In a further embodiment of the method employing a steady-state pulse sequence, a slice selection gradient is activated simultaneously with one of the RF pulses, such that this selectively acts on the slice of interest. This has the advantage that typically used slice selection gradients can be used in the method.

In another embodiment of the method employing a steady-state pulse sequence, for accelerated adoption of an equilibrium state of the magnetization, a non-selective $\alpha/2$ RF pulse (that effects a deflection of the magnetization vector by an angle with the magnitude $\alpha/2$ on the slice of interest) is emitted at the beginning of the pulse sequence. This has the advantage that the equilibrium state adjusts faster since the $\alpha/2$ RF pulse reduces magnetization oscillations at the beginning of the sequence.

In a further embodiment of the method employing a steady-state pulse sequence, for magnetization preparation a $\beta$ RF pulse acting non-selectively on the slice of interest, is emitted. This $\beta$ RF pulse effecting a deflection of the magnetization vector by an angle $\beta$, and is emitted at the beginning of the pulse sequence. $\beta$ is, for example, given as follows by the equilibrium magnetization $M_{GG}$, the output magnetization $M_0$ and the angle $\alpha$:

$$\beta = \arccos\left(\frac{M_{GG}}{M_0 \cos(\alpha/2)}\right).$$

This has the advantage that the transient effect time is reduced since the magnetization is in particular adapted to the equilibrium state in combination with the $\alpha/2$ RF pulse. A spoiler gradient field is thereby preferably additionally emitted as a part of the slice selection gradient in order to bring the transverse magnetization according to the $\beta$ RF pulse out of phase.

The above object is achieved in accordance with the invention by a magnetic resonance apparatus with a sequence for operating an RF unit and a gradient coil system to emit an RF pulse in a steady-state pulse sequence with a slice selection gradient and with a readout gradient, as described above.

DESCRIPTION OF THE DRAWINGS

FIG. 1 is a schematic block diagram of a magnetic resonance apparatus for implementing the method employing a steady-state pulse sequence in accordance with the invention.

FIG. 2 is a schematic representation of an exemplary series of RF pulses and the gradient fields used in the steady-state pulse sequence in the inventive method.

FIG. 3 explains the effect of the setting parameter from FIG. 2 on the magnetization.

DESCRIPTION OF THE PREFERRED EMBODIMENTS

Figure 4:
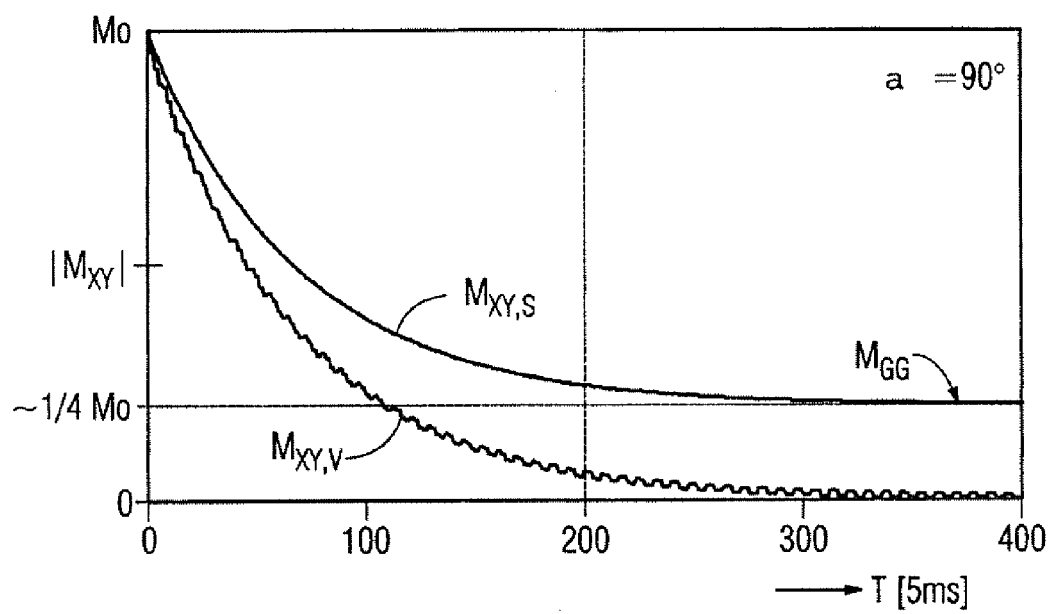
FIG. 4 is a curve of the magnitude of the transverse magnetization outside of a slice of interest given RF pulses with $|\alpha|=90°$, as occurs with a steady-state pulse sequence corresponding to FIG. 2.

A magnetic resonance apparatus M to implement the inventive method is schematically shown in FIG. 1. An examination subject 1 is positioned in a basic field magnet 3. Gradient coils 5 and radio-frequency transmission and reception antennas 7 are incorporated into the magnet 3. The gradient coils 5, of which three sets are present for three spatial directions, are triggered by a gradient amplifier 9. The RF pulses are controlled by an RF pulse sequence unit 11 to excite nuclear magnetic resonance in the examination subject 1, meaning for magnetization deflection. The radio-frequency receiving unit 13 receives the resulting magnetic resonance signals generated by the relaxation of the magnetization and implements a phase-sensitive demodulation and a sampling of the space. The RF pulse sequence unit 11 and the radio-frequency receiving unit 13, as well as the gradient amplifier 9, are connected with a control unit 17 which controls the gradient amplifier 9 and the pulse sequence unit 11 corresponding with the predetermined RF pulse sequence, for example a steady-state pulse sequence according to the invention. The received magnetic resonance signals are forwarded to an imaging unit (not shown) to generate the magnetic resonance image.

The magnetic resonance apparatus M enables the implementation of the method according to the invention, both in the case of magnetic resonance tomography and in the case of magnetic resonance spectroscopic examination.

FIG. 2 shows an exemplary steady-state pulse sequence for alternating slice-selective and non-slice-selective RF excitation according to the invention. A series of RF pulses $S_{\alpha-}$ and $N_{\alpha+}$, which alternately act either selectively on the slice of interest ($S_{\alpha-}$) or non-selectively on the slice of interest (non-slice-selective RF pulse $N_{\alpha+}$), is shown over time T. The latter act essentially on the entire subject to be examined and are schematically shown by a rectangular bar. The former is indicated by a schematized RF pulse.

In addition to the RF pulses $S_{\alpha-}$, $N_{\alpha+}$, in FIG. 1 the switching times of the slice selection gradients $5_S$ and the readout gradient $5_R$ are plotted in FIG. 1. The slice selection gradient $5_S$ is respectively activated during the radiation of the RF pulse $S_{\alpha-}$. The readout gradient $5_R$ is switched after each of the RF pulses $S_{\alpha-}$, $N_{\alpha+}$. To identify the readout gradient $5_R$, a schematic magnetic resonance signal 21 is additionally shown during each activation. The RF pulses $S_{\alpha-}$, $N_{\alpha+}$ are emitted with a repetition time TR.

For simplifying the representation, no phase coding gradient is shown in FIG. 2, although phase coding gradients are used for spatial coding of the magnetic resonance signals 21 (as is known).

FIG. 3 shows the effect of the steady-state pulse sequence from FIG. 2 on the magnetization, which is indicated by a magnetization vector 31. A deflection angle α of the magnetization, based on the slice-selective pulses $S_{\alpha-}$ and the non-slice-selective pulses $N_{\alpha+}$, has a magnitude of, for example, |90°|. To prevent magnetization oscillations, at time T=0 a non-slice-selective RF pulse $N_{\alpha+/2}$ is radiated on the examination subject, which leads to a deflection of the magnetization vectors $31_0$ by an angle of +45° at the point in time T=0.

To explain the various effects of the RF pulses on the magnetization in and outside of the slice of interest, in FIG. 3 the examination subject is divided into the slice of interest 33 and the volumes 35 lying on both sides outside of the slice 33 of interest.

A first slice-selective RF pulse $S_{\alpha-}$ is now emitted at intervals of a half repetition time TR of the RF pulse $N_{\alpha+/2}$. This acts only on the slice 33 with the slice thickness ΔZ. The magnetization vector $31_0$ is deflected by the angle −90° in the slice 33. In contrast to this, the magnetization vectors in volumes 35 are not influenced. The magnetization vectors $31_{1,V}$ and $31_{1,S}$ are obtained.

After the repetition time TR, a first non-slice-selective RF pulse $N_{\alpha+}$ is emitted to the examination subject. Both the magnetization vectors of the volume 35 and the magnetization vector in the slice 33 are correspondingly deflected by an angle of +90°. The magnetization vectors $31_{2,V}$ and $31_{2,S}$ are obtained.

After the repetition time TR, a further slice-selective RF pulse $S_{\alpha-}$ is emitted, and after another repetition time TR the first non-slice-selective RF pulse $N_{\alpha+}$, and so on. It is clearly recognizable that in the slice 33 the magnetization vector has adopted its dynamic equilibrium state, since it is always deflected by an angle ±α/2 of the basic magnetic field direction. In contrast to this, the magnetization vectors circulate in their alignment in volume 35 based on their non-slice-selective RF pulse $N_{\alpha+}$. This leads to an alternating direction of the T1 and T2 relaxation of the magnetization, and thus effects the significant signal reduction in volume 35.

FIG. 4 shows the temporal behavior of the absolute value (magnitude) of the transverse magnetizations $M_{XY,V}$ and $M_{XY,S}$ in volume 35 and in the slice 33 given RF pulses $S_{\alpha-}$, $N_{\alpha+}$ with a deflection angle α of ±90°. A longitudinal relaxation time T1 of 1200 ms, a transverse relaxation time T2 of 200 ms, and a repetition time TR of 5 ms have thereby been assumed. The transverse magnetizations $M_{XY,V}$ and $M_{XY,S}$ are plotted over the time T in units of the repetition time of 5 ms.

At the point in time T=0, both transverse magnetizations $M_{XY,V}$ and $M_{XY,S}$ in volume 35, as in the slice 33, exhibit the maximum output magnetization $M_0$. The transverse magnetization $M_{XY,S}$ in the slice initially decreases and approaches the equilibrium magnetization $M_{GG}$. The transverse magnetization $M_{XY,V}$ in the volume 35 drops off sharply. After approximately 300 repetition times TR, it exhibits a very small absolute value ε. After approximately 190 repetition times TR, the transverse magnetization $M_{XY,S}$ exhibits approximately one-quarter of the output magnetization $M_0$. The phase coding then begins in a typical manner after the transient event. It can be clearly recognized no signal contributions are received from the volume 35 after the transient event. Were it measured during the transient effects, additional artifacts would be possible.

The magnetic resonance signal measured with the reception antenna accordingly comprises various signal contributions that can change with the time T in terms of their strength. They always have a signal portion that originates from the slice of interest.

During the transient event, a signal portion is additionally received from the volume surrounding the slice after the non-slice-selective excitations. This rapidly abates, such that the signal contribution by the volume is reduced for the most part to a negligible quantity ε in the equilibrium state of the magnetization. This means that, as soon as the RF pulses generate a steady-state signal in the slice of interest, the magnetization in the examination subject outside of the slice of interest is significantly reduced.

Figure 5:
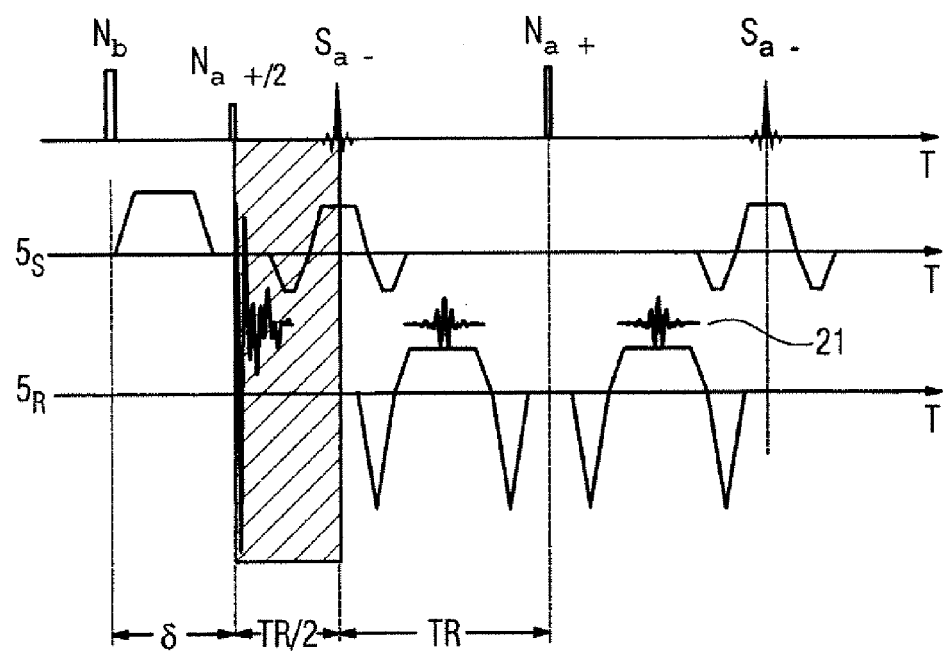
FIG. 5 shows a steady-state pulse sequence corresponding to FIG. 2, additionally with a non-selective $\beta$ RF pulse and a non-selective $\alpha/2$ RF pulse.

In FIG. 5, the exemplary steady-state sequence from FIG. 2 has been expanded by the non-slice-selective α/2 RF pulse $N_{\alpha+/2}$ and a non-slice-selective β RF pulse $N_\beta$. The α/2 RF pulse $N_{\alpha+/2}$ ensues before the first RF pulse $S_{\alpha-}$ in the temporal interval TR/2 and effects a faster transient effect due to reduced magnetization oscillations in the transient effect time.

The β RF pulse $N_\beta$ ensues just before the α/2 RF pulse $N_{\alpha+/2}$ in the temporal interval δ and reduces the longitudinal magnetization, and with it the magnetization transient effect time, in combination with a spoiler gradient field of the slice selection gradient $5_S$ generated subsequently.

Also, no phase coding gradient was shown in FIG. 5 for purposes of a clear representation.

Figure 6:
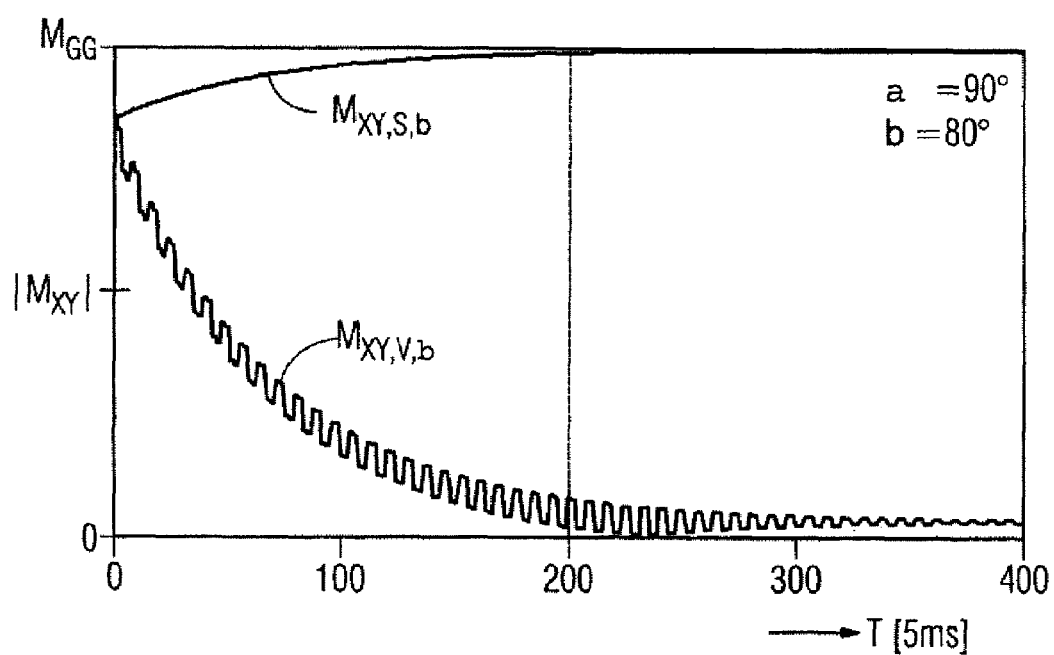
FIG. 6 is a curve of the magnitude of the transverse magnetization outside of a slice of interest, as occurs with a steady-state pulse sequence corresponding to FIG. 5.

Given simulation parameters corresponding to FIG. 4, FIG. 6 shows the behavior of the transverse magnetizations $M_{XY,S,\beta}$ and $M_{XY,V,\beta}$ given use of a magnetization preparation pulse at the angle β=80° at the beginning of the steady-state pulse sequence according to FIG. 5.

The significant drop-off of the transverse magnetization $M_{XY,V,\beta}$ to a negligible quantity is again clearly seen in volume 35. A difference results in the behavior of the transverse magnetization $M_{XY,S,\beta}$. Due to the magnetization preparation with the angle β, this drops at the time T=0 below the equilibrium magnetization $M_{GG}$ and subsequently rises to the value of the equilibrium magnetization $M_{GG}$.

After 190 repetition times TR, it has nearly achieved the equilibrium magnetization. It can be seen that, with a magnetization preparation with a non-slice-selective RF pulse $N_\beta$, the steady-state sequence of the outer volume 35 is rapidly forced to zero, and the signal of the slice 33 is rapidly forced to equilibrium.

Alternating non-slice-selective and slice-selective RF excitations given SSFP sequences (SSFP steady state free precession) are not simple to describe with regard to their signal behavior before the assumption of the equilibrium. Therefore, the ensuing signals within the sequence were only schematically shown. In the established equilibrium state, the known steady-state character results again.

Using SSFP sequences adapted according to the invention, blood that flows into the slice is shown dark in dynamic heart examinations, for example with the adapted True-FISP sequence from FIG. 2. Ventricle fill defects, valve defects and so on are shown clearer with the mixing of the dark blood. As described above, the dark blood representation (for example, with the inventively adapted True-FISP sequence) can be advantageously applied in heart applications, and the "late enhancement" areas can be shown with stronger contrast after contrast agent administration.

Likewise, in the representation of vessel deposits (vessel wall and plaque representation) the method can lead to a contrast improvement of the vessel lumen in comparison with deposits.

With the inventive method, sequential multi-layer 2D or, respectively, 3D measurements are possible. For example, the expansion of the 2D True-FISP sequence to the 3D variants is realized as usual via an additional phase coding in the slice direction. The signal consideration corresponds to the visualized excitation.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for operating a magnetic resonance apparatus comprising the steps of:
   generating a steady-state free precession pulse sequence; and
   in said steady-state free precession pulse sequence, generating an additional RF pulse acting non-selectively on said same slice of interest in alteration to generate at least a 2D image of the subject.

2. A method as claimed in claim 1 comprising generating said RF pulse acting selectively on the slice of interest with a flip angle $+\alpha$ and generating said RE pulse acting non-selectively on said slice of interest with a flip $-\alpha$.

3. A method as claimed in claim 1 comprising, in said steady-state pulse free-precession sequence, generating a slice selection gradient simultaneously with said RF pulse selectively acting on the slice of interest.

4. A method as claimed in claim 1 comprising, in said steady-state free-precession pulse sequence, after each RF pulse, generating a readout gradient for reading out a steady-state signal.

5. A method as claimed in claim 1 comprising, at a beginning of said steady-state free-precession pulse sequence, generating an $\alpha/2$ RF pulse for deflecting a magnetization vector in the slice of interest by an angle having a magnitude $\alpha/2$, for accelerated adoption of an equilibrium state of the magnetization in the slice of interest.

6. A method as claimed in claim 1 comprising, for magnetization preparation at a beginning of said steady-state free-precession pulse sequence, generating a non-slice-selective $\beta$ RF pulse for deflecting a magnetization value by an angle $\beta$.

7. A method as claimed in claim 6 comprising generating a spoiler gradient as a part of slice selection gradient in association with said $\beta$ RF pulse.

8. A magnetic resonance apparatus comprising:
   an Rf unit for emitting RF pulses for exciting magnetic resonance signals in an examination subject, and for receiving said magnetic resonance signals;
   a gradient coil system operated by a gradient amplifier; and
   a sequencer unit connected to said RF unit and to said gradient amplifier for operating said RF unit and said gradient amplifier with a steady-state free-precession pulse sequence including causing said RF unit to emit an additional RF pulse acting non-selectively on the same slice of interest in alteration to generate at least a 2D image of the subject.

9. A magnetic resonance apparatus as claimed in claim 8 wherein said sequencer unit operates said RF unit for generating said RF pulse acting selectively on the slice of interest with a flip angle of $+\alpha$ and for generating said RF pulse acting non-selectively on the slice of interest with a flip angle of $-\alpha$.

10. A magnetic resonance apparatus as claimed in claim 8 wherein said sequencer unit operates said gradient amplifier for generating a slice selection gradient simultaneously with the RF pulse acting selectively on the slice of interest.

11. A magnetic resonance apparatus as claimed in claim 8 wherein said sequencer unit operates said gradient amplifier for generating a readout gradient after each of said RF pulses, for reading out a steady-state signal.

12. A magnetic resonance apparatus as claimed in claim 8 wherein said sequencer unit, at a beginning of said steady-state free-precession pulse sequence, operates said RF unit for generating an $\alpha/2$ RF pulse, acting non-selectively on said slice of interest, for deflecting a magnetization vector in the slice of interest by an angle having a magnitude $\alpha/2$, for accelerated adoption of an equilibrium state of the magnetization in the slice of interest.

13. A magnetic resonance apparatus as claimed in claim 8 wherein said sequencer unit, for magnetization preparation at a beginning of the steady-state free-precession pulse sequence, operates said RF unit for generating a non-slice-selective $\beta$ Rf pulse for deflecting a measurement value by an angle $\beta$.

14. A magnetic resonance apparatus as claimed in claim 13 wherein said sequencer unit operates said gradient amplifier for generating a spoiler gradient as a part of a slice selection gradient in association with said $\beta$ RF pulse.

* * * * *